(12) United States Patent
Chen et al.

(10) Patent No.: US 9,089,046 B2
(45) Date of Patent: Jul. 21, 2015

(54) ELECTRONIC MODULE AND METHOD FOR SAME

(71) Applicants: UNIVERSAL SCIENTIFIC INDUSTRIAL (SHANGHAI) CO., LTD., Shanghai (CN); UNIVERSAL GLOBAL SCIENTIFIC INDUSTRIAL CO., LTD., Nantou County (TW)

(72) Inventors: Jen-Chun Chen, New Taipei (TW); Pai-Sheng Shih, Nantou County (TW); Hsin-Chin Chang, Taipei (TW)

(73) Assignees: UNIVERSAL SCIENTIFIC INDUSTRIAL (SHANGHAI) CO., LTD., Shanghai (CN); UNIVERSAL GLOBAL SCIENTIFIC INDUSTRIAL CO., LTD., Nantou County (TW)

( * ) Notice: Subject to any disclaimer, the term of this patent is extended or adjusted under 35 U.S.C. 154(b) by 372 days.

(21) Appl. No.: 13/747,979

(22) Filed: Jan. 23, 2013

(65) Prior Publication Data
US 2014/0085857 A1 Mar. 27, 2014

(30) Foreign Application Priority Data
Sep. 24, 2012 (TW) .............................. 101134914 A

(51) Int. Cl.
*H05K 1/18* (2006.01)
*H05K 9/00* (2006.01)
(Continued)

(52) U.S. Cl.
CPC ............ *H05K 9/002* (2013.01); *H01L 23/3121* (2013.01); *H01L 23/49805* (2013.01);
(Continued)

(58) Field of Classification Search
CPC ................ H05K 1/0215; H05K 1/185; H05K 2201/10446; H05K 2201/10674; H05K 1/0222; H05K 1/0219; H05K 9/0039; H05K 1/18; H05K 1/10
USPC .......... 361/760–767, 816, 818; 174/520–525, 174/250–258; 257/685–690, 787–790
See application file for complete search history.

(56) References Cited

U.S. PATENT DOCUMENTS 6,686,649 B1 *  2/2004  Mathews et al. ............... 257/659
7,187,060 B2 *  3/2007  Usui .............................. 257/659
(Continued)

FOREIGN PATENT DOCUMENTS

EP   1 450 400        8/2004
TW   I311904          7/2009
TW   201008478 A1    2/2010

OTHER PUBLICATIONS

Taiwan Patent Office, Office Action issued on Mar. 13, 2014.
(Continued)

*Primary Examiner* — Tuan T Dinh
(74) *Attorney, Agent, or Firm* — Foley & Lardner LLP; Cliff Z. Liu; Angela D. Murch

(57) ABSTRACT

An electronic module includes a circuit board, a plurality of electronic components, a plurality of molding layers, at least one first conductive layer, at least one insulating filler, and one second conductive layer. The circuit board has a first plane and at least one grounding pad on the first plane. The electronic components are mounted on the first plane and electrically connected with the circuit board. The molding layers cover the electronic components and the first plane. The trench appears between two adjacent molding layers. The grounding pad is positioned at the bottom of the trench. The first conductive layer covers the sidewall of the trench and the grounding pad. The grounding pad electrically connected with the first conductive layer. The insulating filler is positioned in the trench. The second conductive layer covers the molding layers and the insulating filler, and electrically connects with the first conductive layer.

17 Claims, 5 Drawing Sheets

(51) Int. Cl.
*H05K 3/10* (2006.01)
*H05K 1/02* (2006.01)
*H05K 3/28* (2006.01)
*H01L 23/31* (2006.01)
*H01L 23/498* (2006.01)
*H01L 23/552* (2006.01)
*H01L 25/16* (2006.01)
*H01L 23/00* (2006.01)

(52) U.S. Cl.
CPC ........ *H01L23/49811* (2013.01); *H01L 23/552* (2013.01); *H05K 1/0218* (2013.01); *H05K 3/107* (2013.01); *H05K 3/284* (2013.01); *H05K 9/0037* (2013.01); *H01L 23/562* (2013.01); *H01L 25/16* (2013.01); *H01L 2224/16* (2013.01); *H05K 2201/0715* (2013.01); *H05K 2201/0919* (2013.01); *H05K 2201/09509* (2013.01); *H05K 2203/1316* (2013.01)

(56) References Cited

U.S. PATENT DOCUMENTS

| | | | |
|---|---|---|---|
| 7,478,474 | B2 | 1/2009 | Issei Koga |
| 8,410,584 | B2 | 4/2013 | An et al. |
| 2006/0145361 | A1* | 7/2006 | Yang et al. ............ 257/787 |
| 2010/0285636 | A1 | 11/2010 | Chen |
| 2011/0115066 | A1* | 5/2011 | Kim et al. ............ 257/690 |
| 2012/0187551 | A1 | 7/2012 | Kushino et al. |

OTHER PUBLICATIONS

Ling, Ding-Hao, "Electronic Packaging Technology Introduction", Dissertation, Taiwan Print Circuit Association, 2010, p. 54, Taiwan.
Search Report and Written Opinion for Application No. 1353123 Co-Pending in France, issued on Nov. 19, 2014, 8 Pages.

* cited by examiner

ELECTRONIC MODULE AND METHOD FOR SAME

BACKGROUND

1. Technical Field

The invention relates to an electronic module and the manufacturing method for the same, and in particular, to an electronic module with an electro-magnetic interference (EMI) shielding structure and the manufacturing method for the same.

2. Description of Related Art

In the modern electronic module, the electronic components are usually electrically connected with the wiring board, so that the electronic signal could be transmit between the electronic components and the wiring board. However, some of the electronic components like high frequency digit components and radio frequency (RF) components generate the electro-magnetic interference, so that the operation of the electronic component inside the electronic module may be influenced. That is to say, the interference might appear inside the electronic module, and the normal operation of the electronic component is affected.

SUMMARY

The present invention provides an electronic module with an electro-magnetic interference shielding structure.

The present invention provides a manufacturing method to fabricate the above-mention electronic module.

The present invention provides an electronic module including a circuit board, a plurality of electronic components, a plurality of molding layers, at least one first conductive layer, at least one insulating filler and one second conductive layer. The circuit board has a first plane and at least one grounding pad, where the grounding pad is on the first plane. The electronic components are mounted on the first plane and electrically connected with the circuit board. The molding layers cover the electronic components and the first plane. A trench appears between two of the adjacent molding layers. The grounding pad is positioned at the bottom of the trench. The first conductive layer covers the side wall of the trench and the grounding pad, and the first conductive layer electrically connects with the grounding pad. The insulating filler is filled in the trench. The second conductive layer covers the molding layers and the insulating filler. Besides, the first conductive layer electrically connects with the second conductive layer. The insulating filler is positioned between the second conductive layer and the first conductive layer.

The present invention provides a manufacturing method of the electronic module. Firstly, an electronic molding module is provided. The electronic molding module includes a circuit board, a plurality of electronic components and the molding compound layer. The circuit board includes a first plane and at least one grounding pad, in which the grounding pad is located on the first plane. The electronic components are mounted on the first plane and electrically connected with the circuit board. The molding compound layer is positioned on the first plane and covers the first plane, the grounding pad, and the electronic components. Next, a protecting layer is formed on and covers the molding compound layer. After that, the molding compound layer and the protecting layer are diced to form a plurality of molding layers and at least one trench. The trench appears between two of the adjacent molding layers and exposes the grounding pad. Next, the first conductive layer is formed in the trench. The first conductive layer covers the side wall of the trench and the grounding pad, and is electrically connected with the grounding pad. Then, the insulating filler is formed in the trench. After that, the second conductive layer is formed on the molding layers and the insulating filler. The first conductive layer is electrically connected with the second conductive layer.

To sum up, the present invention provides the electronic module and the manufacturing method for the same. The first conductive layer covers the side wall of the trench and connects with the grounding pad. The second conductive layer covers the molding layers and the insulating filler, and connects with the first conductive layer and the grounding pad. Thus, the first conductive layer and the second conductive layer are taken as the electro-magnetic interference shielding structure, so as to prevent the operation of the electronic components from the influence of the electro-magnetic interference. Hence, the influence of the electro-magnetic interference to the operational electronic components might be decreased.

In order to further appreciate the characteristic and technical contents of the present invention, references are hereunder made to the detailed descriptions and appended drawings in connection with the present invention. However, the appended drawings are merely shown for exemplary purpose rather than being used to restrict the scope of the present invention.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1A:
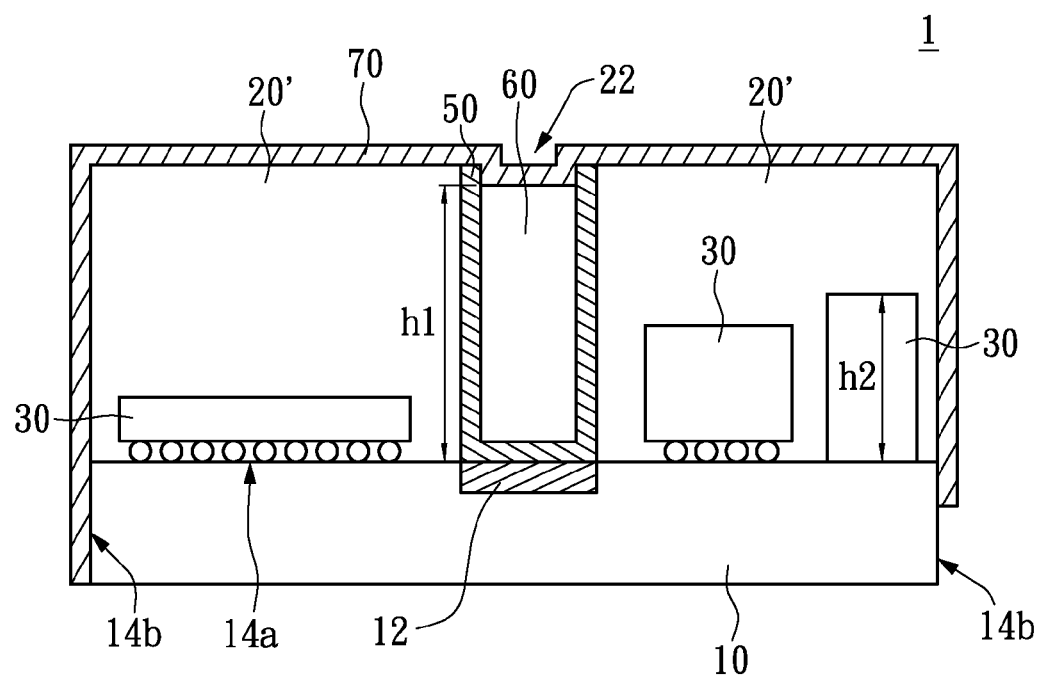
FIG. 1A is a cross-sectional view of the electronic module in an embodiment of the present invention.
Figure 1B:
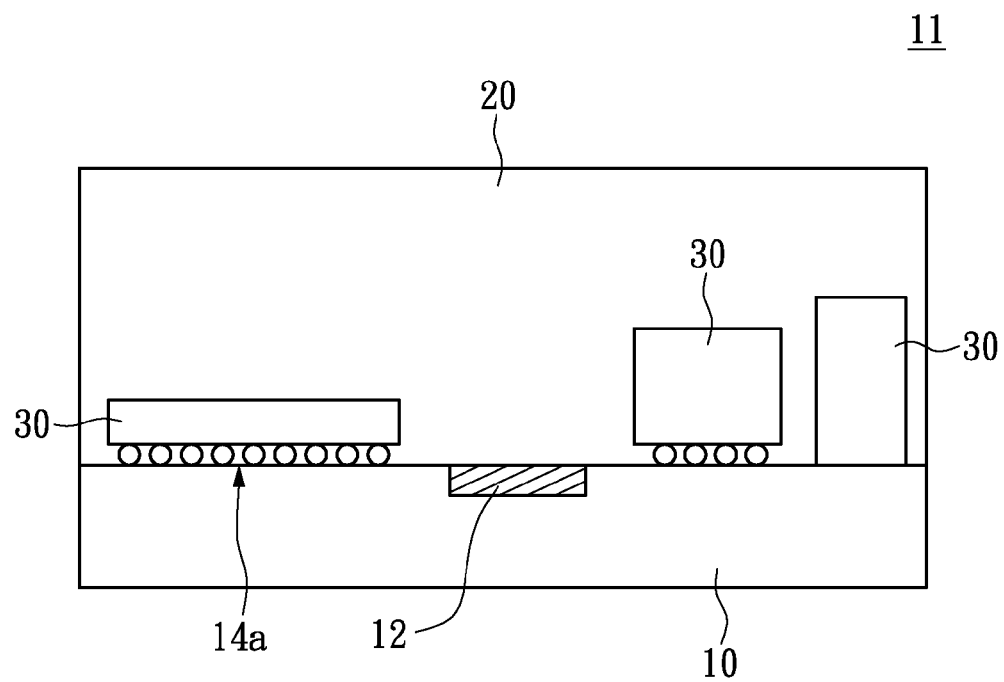
FIG. 1B to FIG. 1H illustrate the manufacturing method of the electronic module in FIG. 1A.

FIG. 1A is a cross-sectional view of the electronic module 1 in an embodiment of the present invention. The electronic module 1 shown in FIG. 1A includes a circuit board 10, a plurality of electronic components 30, a plurality of molding layers 20', at least one first conductive layer 50, at least one insulating filler 60 and one second conductive layer 70.

Referring to FIG. 1A, the circuit board 10 includes a first plane 14a, four side walls 14b and at least one grounding pad 12. The four side walls 14b are adjacent to the first plane 14a, and connected with the edge of the first plane 14a. It's necessary to mention that FIG. 1A is a cross-sectional view of the electronic module 1, and thus the number of the side walls 14b in FIG. 1A is two. However, in reality, a person of ordinary skill in the art can recognize that the electronic module 1 is a three dimensional structure, so that the number of the side walls 14b of the circuit board 10 is four.

The grounding pad 12 is positioned on the first plane 14a. Besides, no restriction is intended for the shape and the size of the grounding pad 12, that is to say, the shape of the grounding pad 12 could be strip-shaped, round disk-shaped or square disk-shaped. In addition, the number of the grounding pad 12 included by the electronic module 1 could be one or more. While the number of the grounding pad 12 is more than one, the grounding pads 12 could be arranged in a line. A plurality of the electronic components 30 are mounted on the first plane 14a, and electrically connected with the first plane 14a. Furthermore, the height of the highest electronic component 30 among all the electronic components 30 relative to the first plane 14a is h2.

A plurality of molding layers 20' encapsulate the electronic components 30 and cover the first plane 14a of the circuit board 10. The molding layers 20' could encapsulate one or more electronic components 30. Taking the FIG. 1A for example, the number of the electronic components 30 encapsulated by the molding layer 20' on the right is two. The material of the molding layers 20' contain 10 to 20 wt % epoxy resin, and the coefficient of thermal expansion of the molding layers 20' is that $\alpha 1:0.6\times 10-5/\square$ to $1.0\times 10-5/\square$ and/or $\alpha 2:3.5\times 10-5/\square$ to $4.5\times 10-5/\square$. In addition, a trench 22 appears between two adjacent molding layers 20'. The grounding pad 12 is at the bottom of the trench 22.

In this embodiment, the circuit board 10 is a double side wiring board. However, in other embodiment, the circuit board 10 could be a multilayer wiring board. While the circuit board 10 is the multilayer wiring board, the electronic components 30 are mounted on the outer wiring layer of the circuit board 10 and electrically connected with the outer wiring layer. Besides, two of the wiring layers inside the circuit board 10 might be electrically connected with each other via the through hole or the blind hole. It is worth noting that no restriction is intended for the number of the layers in the circuit board 10 in the present invention.

On the other hand, the electronic components 30 could be dies or packaged chips. In addition, the electronic components 30 could be the passive components, such as resistors, inductors or capacitors. In this embodiment, the flip-chip packaging might be utilizes to mount the electronic components 30 on the first plane 14a. However, in other embodiment, the method of wire-bonding packaging might be utilizes to mount the electronic components 30 on the first plane 14a.

In the embodiment referring to the FIG. 1A, the number of the grounding pad 12 in the electronic module 1 might be just one. Besides, the grounding pad 12 is positioned at the bottom of the trench 22. However, in other embodiment, the number of the grounding pad 12 in the electronic module 1 might be more than one. Some of the grounding pads 12 might be positioned at other region expect the trench 22 and encapsulated by the molding layers 20', and the other grounding pads 12 might be positioned at the bottom of the trench 22 and might not be covered by the molding layers 20'.

In addition, referring to FIG. 1A, the first conductive layer 50 covers the side wall of the trench 22 and the grounding pad 12 at the bottom of the trench 22. The above-mentioned first conductive layer 50 electrically connects with the grounding pad 12. That is to say, the first conductive layer 50 is the conductive layer inside the trench 22. In other embodiment, the electronic module 1 might include a plurality of trenches 22 which can't connect with each other, so that the number of the first conductive layer 50 inside the electronic module 1 might be more than one. Therefore, no restriction is intended for the numbers of both the trench 22 and the first conductive layer 50 in the circuit board 10 in the present invention.

The insulating filler 60 is formed in the trench 22. The material of the insulating filler 60 contain 10 to 20 wt % epoxy resin, and the coefficient of thermal expansion of the insulating filler 60 is that $\alpha 1:0.6\times 10-5/\square$ to $1.0\times 10-5/\square$ and/or $\alpha 2:3.5\times 10-5/\square$ to $4.5\times 10-5/\square$. Moreover, the height of the insulating filler 60 relative to the first plane 14a is h1. The height of the insulating filler 60 h1 is greater than the height of the highest electronic component 30 h2, that's to say, height of the insulating filler 60 h1 is greater than the heights of all the electronic components 30 relative to the first plane 14a.

In the embodiment, the material of the molding layers 20' and the insulating filler 60 might be the same or similar to each other. For example, the material of both the insulating filler and the molding layers contain 10 to 20 wt % epoxy resin, so that the coefficient of thermal expansion of the molding layers 20' and the insulating filler 60 might be similar. The coefficient of thermal expansion of the molding layers 20' and the insulating filler 60 are similar. Hence, the degree of the board warp in the electronic module 1 might be decreased while the temperature is change. Thus, the reliability of the electronic module 1 might be increased.

Furthermore, in the embodiment, the thickness of the first conductive layer 50 might be within 30 um. The thinner the first conductive layer 50 is, the smaller the volume of the first conductive layer 50 is changed on the influence of the thermal expansion. Besides, while the thickness of the first conductive layer 50 is less than 30 um, the degree of the board warp in the electronic module 1 might be decreased, and the reliability of the electronic module 1 might be increased. However, the present invention is not limited thereto. The thickness of the above-mentioned first conductive layer 50 could be adjusted depend on various condition.

Referring to FIG. 1A, the second conductive layer 70 covers the molding layers 20' and the insulating filler 60. The top surface of the molding layers 20', and the insulating filler 60 are covered by the second conductive layer 70. Thus, the insulating filler 60 is positioned between the first conductive layer 50 and the second conductive layer 70. The insulating filler 60 could contact to both the first conductive layer 50 and the second conductive layer 70. The second conductive layer 70 extends from the top surface of the molding layers 20' to the side surface of the molding layers 20' and at least one of the side walls 14b of the circuit board 10, so that the second conductive layer 70 covers the side surface of the molding layers 20'.

In addition, no restriction is intended for extending length of the second conductive layer 70 in the present invention. As shown in FIG. 1A, in the embodiment, the second conductive layer 70 could cover at least one of the side walls 14b entirely. On the other hand, the second conductive layer 70 could cover at least one of the side walls 14b partially. In other embodiment, the second conductive layer 70 could not extend to any one of the four side walls 14b. That's to say, the second conductive layer 70 could not cover any one of the four side walls 14b. Furthermore, the second conductive layer 70 is electrically connected with the first conductive layer 50.

FIG. 1B to FIG. 1H illustrate of the manufacturing method of the electronic module 1. Referring to 1B, first of all, an electronic molding module 11 is provided. It's necessary to mention that the electronic molding module 11 is a semi-finished product of the electronic module 1. The electronic molding module 11 includes a circuit board 10, a plurality of the electronic components 30 and a molding compound layer 20. The electronic components 30 are mounted on the circuit board 10, so that the electronic components 30 are located on the first plane 14a and electrically connected with the circuit board 10.

In addition, the electronic molding module 11 could be made from dicing a large-scale molding module. That's to say, laser cutting or mechanical cutting could be utilized to dice the large-scale molding module to form the electronic molding module 11. The structure of the electronic molding module 11 is similar to that of the large-scale molding module. For instance, the large-scale molding module includes a large-scale circuit board, a plurality of electronic components and a molding compound layer. The electronic components are mounted on the large-scale circuit board, and the molding compound layer encapsulates the electronic components.

Figure 1C:
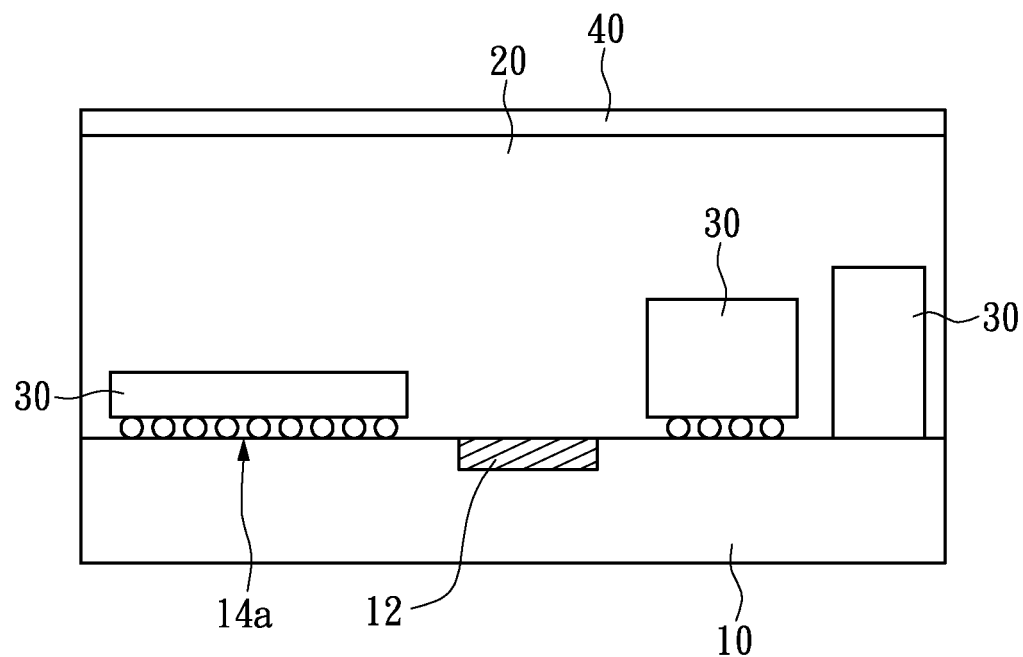

Referring to FIG. 1C, next, a protecting layer 40 is formed on the molding compound layer 20 and covers the molding compound layer 20. The material of the protecting layer 40 contains silicon dioxide powder and poly methyl methacrylate. The protecting layer 40 could absorb the particle such as dust. The method of forming the protecting layer 40 includes coating a protecting compound layer (not shown in the figure) on the molding compound layer 20. After that, the protecting compound layer is cured to form a protecting layer 40 on the molding compound layer 20. The protecting compound layer could be cured by heat or ultraviolet radiation. However, no restriction is intended for curing the protecting compound layer in the present invention.

Figure 1D:
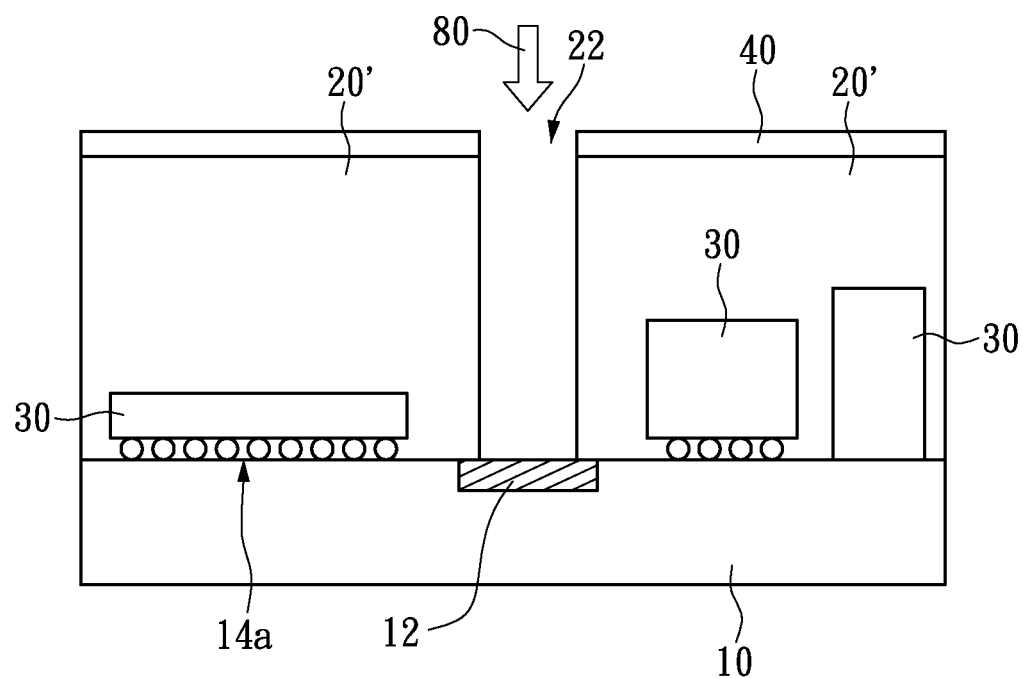

Referring to FIG. 1D, next, the molding compound layer 20 and the protecting layer 40 are cut to form a plurality of molding layers 20' and at least one trench 22. The trench 22 is positioned between two adjacent molding layers 20', and exposes the grounding pad 12. In addition, the above-mentioned cutting process is only utilized to cut the molding compound layer 20 and the protecting layer 40 rather than to cut the circuit board 10 into a plurality of circuit boards.

The method of laser cutting or mechanical cutting could be utilizes to cut the molding compound layer 20 and the protecting layer 40. The laser beam 80 of the laser cutting could be green laser, that is, the wavelength of the laser beam 80 is such as 532 nm. After laser cutting, a small section of the molding compound layer 20 might remain at the bottom of the trench 22, that's to say, the small section of the molding compound layer 20 might remain on the top of the grounding pad 12. The remaining molding compound affects the quality of electrically connection between the first conductive layer 50 and the grounding pad 12 formed in the following process. Thus, the process of desmear could be performed after laser cutting. For instance, the chemical agent or the plasma is utilized to remove the molding compound layer 20 remained on the grounding pad 12. Therefore, the quality of the electrically connection between the first conductive layer 50 and the grounding pad 12 could be maintain.

On the other hand, the dust which affects the quality of the electronic module 1 might be produced during the process of laser cutting. However, since the protecting layer 40 covers the molding compound layer 20, the dust doesn't attach the molding compound layer 20. That's to say, the protecting layer 40 could protect the molding compound layer 20 from the influence of the dust caused by laser cutting. In addition, in other embodiment, other cutting method could be utilized. No restriction is intended for cutting the molding compound layer 20 and the protecting layer 40 in the present invention.

Figure 1E:
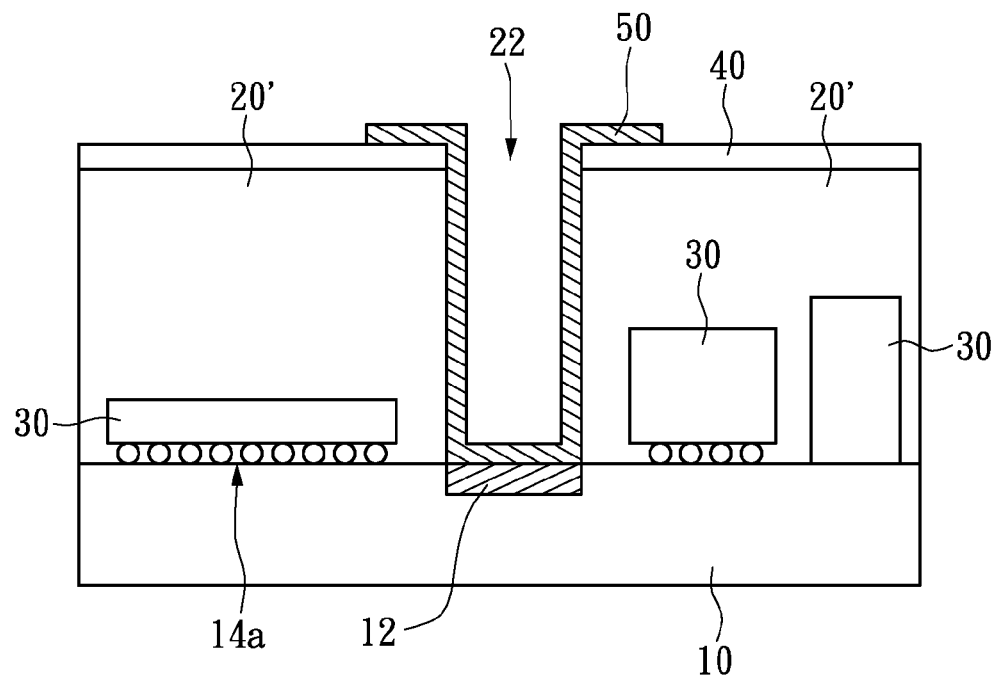

Referring to FIG. 1E, next, the first conductive layer 50 is formed in the trench 22 and covers the protecting layer 40 partially. Specifically, the first conductive layer 50 covers the side walls of the trench 22, the grounding pad 12 and a part of the protecting layer 40 surrounded the opening of the trench 22. The first conductive layer 50 is electrically connected with the grounding pad 12. It's necessary to mention that the method to form the first conductive layer 50 could be sputtering, printing and spraying. However, no restriction is intended for the method to form the first conductive layer 50 in the present invention.

Figure 1F:
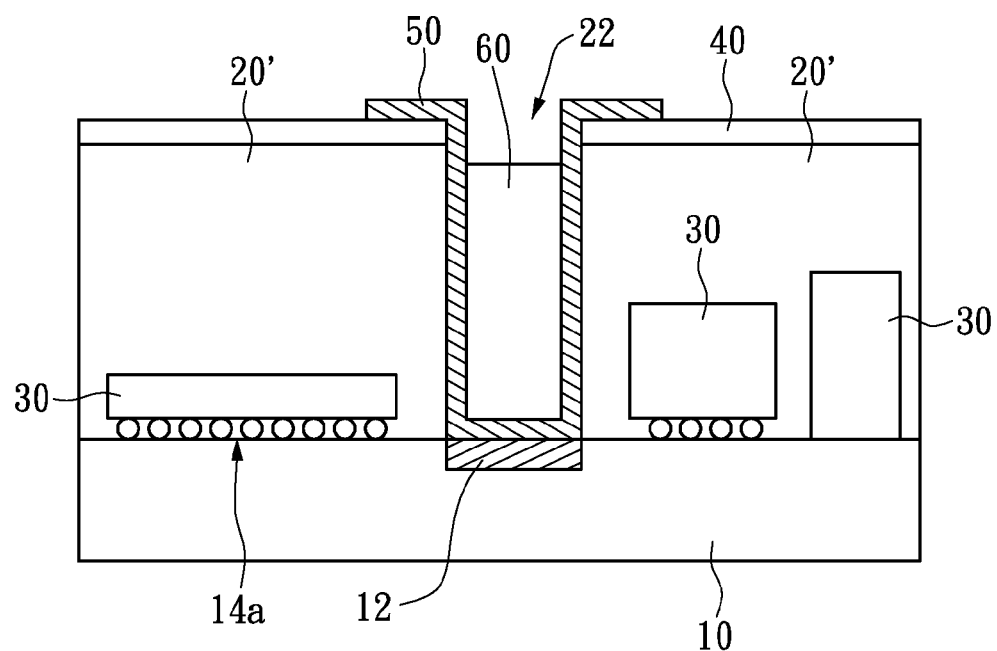

Referring to FIG. 1F, next, the insulating filler 60 contacted the first conductive layer 50 is formed in the trench 22. The process of forming the insulating filler 60 includes that the insulated filling compound is filled into the trench 22, and then the insulated filling compound is cured. Thus, the insulating filler 60 is formed in the trench 22.

It's necessary to mention that the width of the trench 22 is 80 um. Hence, in the embodiment, the viscosity of the insulated filling compound is less than 40 cps, so as to decrease the difficulty of filling the insulated filling compound into the trench 22. On the other hand, the method of curing the insulated filling compound includes heating or ultraviolet radiation. However, no restriction is intended for curing the insulated filling compound in the present invention.

Figure 1G:
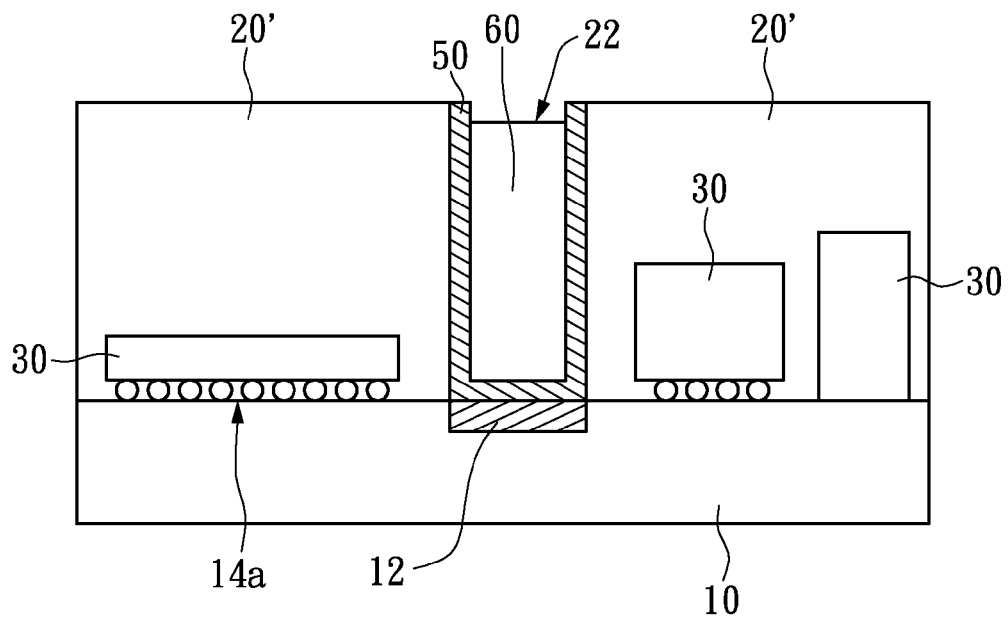
Figure 1H:
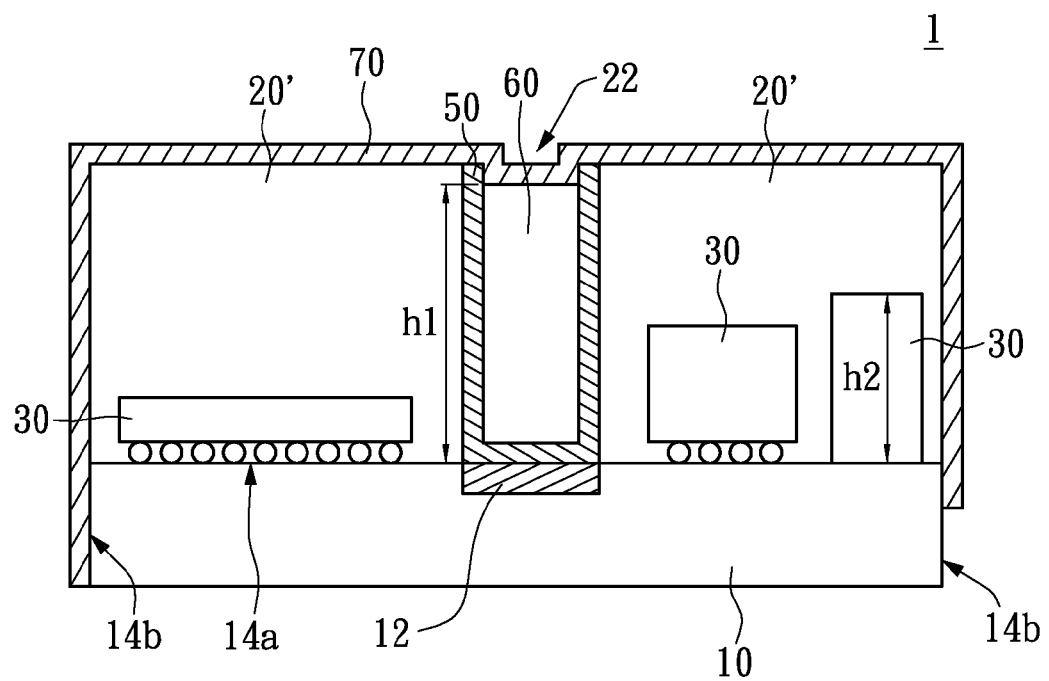

Referring to FIG. 1G, next, the protecting layer 40 is removed by the chemical agent, so as to expose the molding layers 20'. In addition, in the process of removing the protecting layer 40, the first conductive layer 50 covering on the protecting layer 40 is removed simultaneously. Then, referring to the FIG. 1H, the second conductive layer 70 is formed on the molding layers 20' and the insulating filler 60, and electrically connected with the first conductive layer 50. In addition, the second conductive layer 70 extends from the top surface of the molding layers 20' to the side wall of the molding layers 20' and the side walls 14b of the circuit board 10 (as shown in FIG. 1H).

Moreover, no restriction is intended for the extending length of the second conductive layer 70. For example, the second conductive layer 70 could cover at least one of the side walls 14b entirely. On the other hand, the second conductive layer 70 could cover at least one of the side walls 14b partially. Besides, the second conductive layer 70 electrically connects with the first conductive layer 50. The insulating filler 60 could contact with the first conductive layer 50 and the second conductive layer 70. The insulating filler 60 is positioned between the first conductive layer 50 and the second conductive layer 70.

Figure 1I:
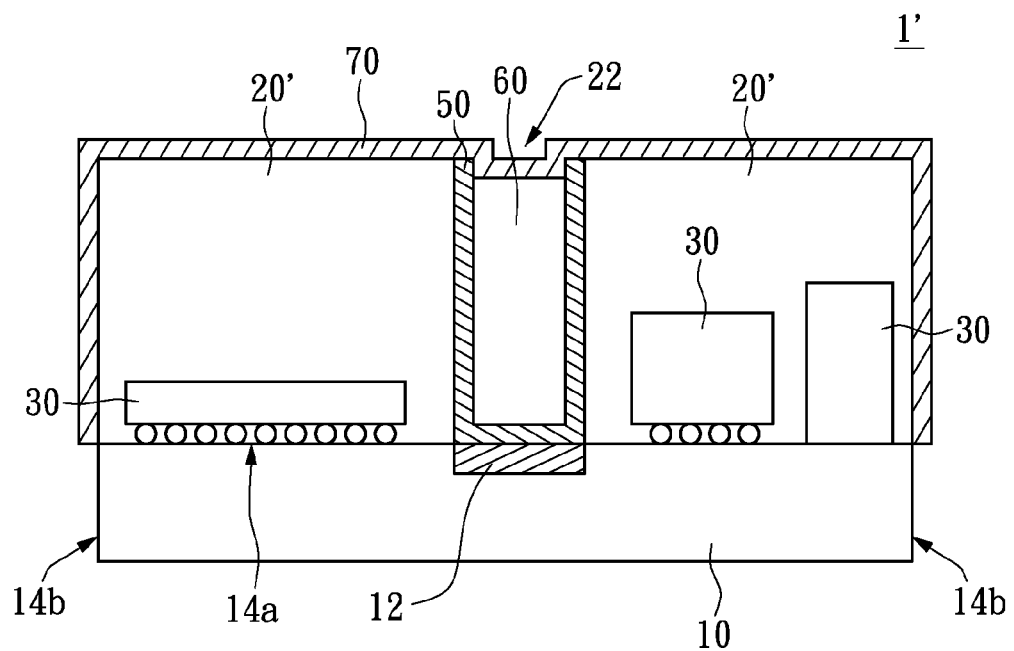
FIG. 1I is a cross-sectional view of the electronic module in another embodiment of the present invention.

FIG. 1I is a cross-sectional view of the electronic module in another embodiment of the present invention. Referring to FIG. 1I, it is different from the electronic module 1 in the previous embodiment. In this embodiment, the second conductive layer 70 could not extend to any one of side walls 14b. It means that the second conductive layer 70 does not cover any one of side walls 14b. As shown in the FIG. 1I, the second conductive layer 70 could only extend from the top surface of the molding layers 20' to the side wall of the molding layers 20'.

Figure 2:
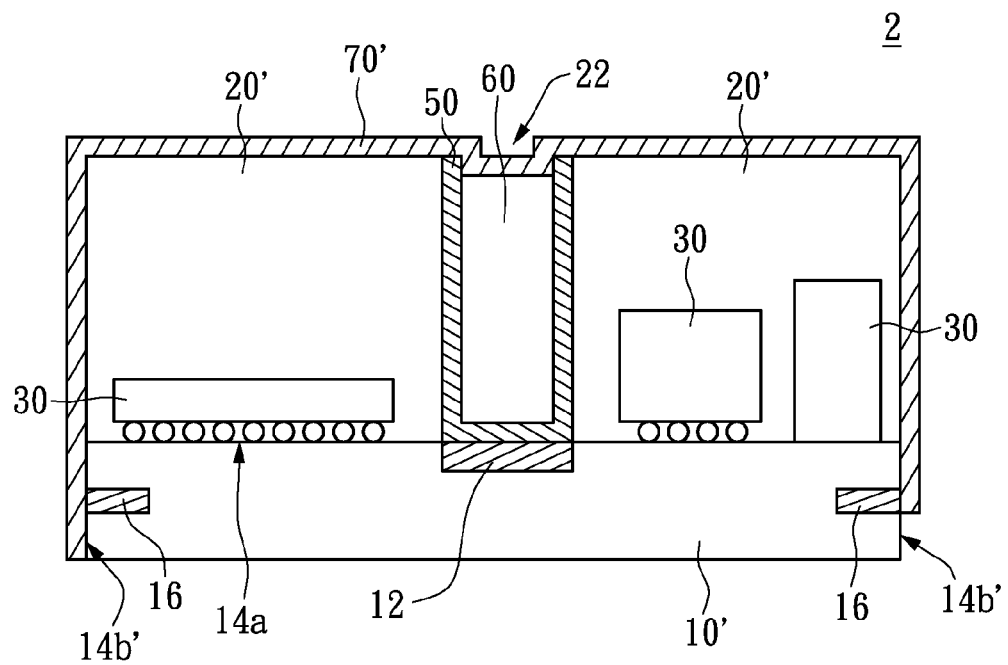
FIG. 2 is a cross-sectional view of the electronic module in another embodiment of the present invention.

FIG. 2 is a cross-sectional view of the electronic module 2 in another embodiment of the present invention. The electronic module 2 in FIG. 2 includes a circuit board 10', a plurality of the electronic components 30, a plurality of the molding layers 20', at least one first conductive layer 50, at least one insulating filler 60 and one second conductive layer 70'.

Referring to FIG. 2, it is different from electronic module 1 in the previous embodiment. The electronic module 2 in this embodiment further includes four side walls 14b' and at least one side pad 16. The side pad 16 is positioned on at least one of the side walls 14b', and at least one side pad 16 is connected to the ground. For example, the side pads 16 electrically connect to the grounding pad 12 or electrically connect to the grounding plane of the circuit board 10' (not shown in FIG. 2). In addition, the electronic module 2 has a plurality of side pads 16 in FIG. 2 (there are two side pads 16 in FIG. 2). However, in other embodiment, the number of the side pads 16 might be just one, no restriction is intended for the number of the side pads 16 in the present invention.

The side walls 14b' is adjacent to the first plane 14a. Besides, the second conductive layer 70' extends from the side walls of the molding layers 20' to the side pads 16, and electrically connects to the side pads 16, so that the grounding pad 12 could electrically connect the side pads 16 though the first conductive layer 50 and the second conductive layer 70'.

Furthermore, as shown in FIG. 2, in this embodiment, the side pads 16 positioned on the middle of the side wall 14b'. However, in other embodiment, the side pads 16 could be positioned on other place of the side wall 14b'. For instance, the side pads 16 could be close to the first plane 14a or far away from the first plane 14a. No restriction is intended for the position of the side pads 16 in the present invention.

Moreover, the second conductive layer 70' should contact to the side pads 16, so as to electrically connect with the side pads 16. No restriction is intended for the extending length of the second conductive layer 70' in the present invention. That's to say, the second conductive layer 70' might cover the side wall 14b' entirely or partially.

It's necessary to mention that the above-mentioned manufacturing method of the electronic module 2 is the same as that of the electronic modules 1 shown in FIG. 1B to FIG. 1H. Thus, a person skilled in the art could find out the manufacturing method of the electronic module 2 from that of the electronic module 1 shown in FIG. 1B to FIG. 1H. Even though the manufacturing method of the electronic module 2 doesn't show here, the above-mention description is sufficient to know for the person skill in the art.

To sum up, the present invention provides an electronic module and the manufacturing method of the same. The above-mentioned electronic module includes the circuit board, a plurality of electronic components, a plurality of molding layers, at least one first conductive layer, at least one insulating filler and the second conductive layer. The electronic module takes the first conductive layer and the second conductive layer as the shield structure of electro-magnetic interference to provide the inner electronic components against the electro-magnetic interference.

In addition, since the difference between the thermal expansion coefficient of both the insulating filler and the molding layers is small, the degree of the board warp in the electronic module might be decreased while the temperature is change. Thus, the reliability of the electronic module might be increased. In addition, in the manufacturing method of present invention, the protecting layer is utilized to prevent the molding compound layer being polluted from the particle such as dust produced in the process of laser cutting the molding compound layer and the protecting layer, so as to decrease the bad influence of the particle to the electronic module.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electronic module, comprising:
   a circuit board with a first plane and at least one grounding pad, wherein the at least one grounding pad is located on the first plane;
   a plurality of electronic components mounted on the first plane and electrically connected with the circuit board;
   a plurality of molding layers covering the electronic components and the first plane, wherein a trench appears between two adjacent molding layers, and at least one grounding pad is located at the bottom of the trench;
   at least one first conductive layer covered the side wall of the trench and the at least one grounding pad, and electrically connected with the at least one grounding pad;
   at least one insulating filler is filled in the trench; and
   one second conductive layer covering the molding layers and the at least one insulating filler and electrically connected with the first conductive layer, wherein the at least one insulating filler is positioned between the second conductive layer and the first conductive layer.

2. The electronic module of claim 1, wherein the material of the insulating filler and the molding layers contain 10 to 20 wt % epoxy resin.

3. The electronic module of claim 1, wherein the insulating filler is contacted to the at least one first conductive layer and the second conductive layer.

4. The electronic module of claim 1, wherein the height of the insulating filler is greater than the height of the electronic components relative to the first plane.

5. The electronic module of claim 1, wherein the circuit board further comprises four side walls adjacent to the first plane, and the second conductive layer extends to one of the side walls.

6. The electronic module of claim 5, wherein the second conductive layer covers one of the side walls entirely.

7. The electronic module of claim 5, wherein the second conductive layer covers one of the side walls partially.

8. The electronic module of claim 5, wherein the circuit board further comprises at least one side pad, wherein the at least one side pad is positioned on one of the side walls, wherein the second conductive layer extends to the side walls and electrically connects with the at least one side pad.

9. The electronic module of claim 1, wherein the width of the trench is 80 um, and the thickness of the first conductive layer is 30 um.

10. A manufacturing method of an electronic module, comprising:
   providing an electronic molding module comprising:
      a circuit board with a first plane and at least one grounding pad on the first plane;
      a plurality of the electronic components mounted on the first plane and electrically connected with the circuit board; and
      a molding compound layer on the first plane, wherein the molding compound layer encapsulates the first plane, the at least one grounding pad and the electronic components;
   forming a protecting layer on the molding compound layer, wherein the protecting layer covers the molding compound layer;
   cutting the molding compound layer and the protecting layer to form a plurality of molding layers and at least a trench, wherein the trench appears between two adjacent molding layers and exposed the at least one grounding pad;
   forming at least one first conductive layer on the trench, wherein the first conductive layer covers the side walls of the trench and the part of the protecting layer and electrically connects to the at least one grounding pad;
   after forming the first conductive layer, forming at least one insulating filler in the trench;
   after filling the at least one insulating filler into the trench, removing the protecting layer to expose the molding layers; and
   forming a second conductive layer on the molding layers and the at least one insulating filler, wherein the second conductive layer electrically connect with the first conductive layer.

11. The manufacturing method of an electronic module of claim 10, wherein the process of forming the protecting layer comprising:
   coating a protecting compound layer on the molding compound layer, wherein the protecting compound layer covers the molding compound layer; and
   curing the protecting compound layer.

12. The manufacturing method of an electronic module of claim 10, wherein the process of forming the insulating filler in the trench comprising:
   filling at least one insulated filling compound into the trench, wherein the viscosity of the at least one insulated filling compound is below 40 cps; and
   curing the at least one insulated filling compound.

13. The manufacturing method of an electronic module of claim 10, wherein the material of the protecting layer comprises silicon dioxide powder and poly methyl methacrylate.

14. The manufacturing method of an electronic module of claim 10, wherein the circuit board further comprises four side walls adjacent to the first plane, and the second conductive layer extends to at least one of the side walls.

15. The manufacturing method of an electronic module of claim 14, wherein the second conductive layer covers the at least one of the side walls entirely.

16. The manufacturing method of an electronic module of claim 14, wherein the second conductive layer covers the at least one of the side walls partially.

17. The manufacturing method of an electronic module of claim 14, wherein the circuit board further comprises at least one side pads positioned on one of the side walls, and the second conductive layer extends to the side wall and electrically connects with the side pads.

\* \* \* \* \*